United States Patent
Galstyan et al.

(10) Patent No.: US 10,600,618 B2
(45) Date of Patent: Mar. 24, 2020

(54) PLASMA GENERATION APPARATUS, SUBSTRATE TREATING APPARATUS INCLUDING THE SAME, AND CONTROL METHOD FOR THE PLASMA GENERATION APPARATUS

(71) Applicant: SEMES CO., LTD., Cheonan-si, Chungcheongnam-do (KR)

(72) Inventors: Ogsen Galstyan, Cheonan-si (KR); Young-Bin Kim, Hwaseong-si (KR); Jamyung Gu, Cheonan-si (KR); Jong-Hwan An, Yongin-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 16/530,468

(22) Filed: Aug. 2, 2019

(65) Prior Publication Data
US 2020/0051784 A1    Feb. 13, 2020

(30) Foreign Application Priority Data

Aug. 7, 2018  (KR) .................. 10-2018-0091736
Mar. 28, 2019  (KR) .................. 10-2019-0035804

(51) Int. Cl.
*H05B 33/00* (2006.01)
*H01J 37/32* (2006.01)
(Continued)

(52) U.S. Cl.
CPC ..... *H01J 37/32082* (2013.01); *H05H 1/0081* (2013.01); *H05H 1/48* (2013.01)

(58) Field of Classification Search
CPC .... H03H 7/40; H03H 7/38; H03H 2001/0057; H03H 1/00; H03H 7/46; H02J 7/025;
(Continued)

(56) References Cited

U.S. PATENT DOCUMENTS 9,082,591 B2    7/2015   Dorf et al.
2002/0041160 A1  4/2002   Barnes et al.

FOREIGN PATENT DOCUMENTS

KR   10-2008-0004710 A   1/2008
KR      101007822 B1     1/2011
(Continued)

*Primary Examiner* — Monica C King
(74) *Attorney, Agent, or Firm* — Harness, Dickey & Pierce, P.L.C.

(57) ABSTRACT

A substrate treating apparatus includes a chamber having a space therein in which a substrate is treated, a support unit that supports the substrate in the chamber, a gas supply unit that supplies gas into the chamber, and a plasma generation unit that excites the gas in the chamber into a plasma state. The plasma generation unit includes a high-frequency power supply, a first antenna connected to one end of the high-frequency power supply, a second antenna connected with the first antenna in parallel, and a current divider that distributes electric current to the first antenna and the second antenna. The current divider includes a first capacitor disposed between the first antenna and the second antenna, a second capacitor connected with the second antenna in parallel, and a third capacitor connected with the second antenna in series. The second capacitor and the third capacitor are implemented with a variable capacitor.

24 Claims, 8 Drawing Sheets

(51) Int. Cl.
*H05H 1/00* (2006.01)
*H05H 1/48* (2006.01)

(58) Field of Classification Search
CPC .. H02J 50/12; H02J 5/005; H02J 50/70; H02J 50/90; H02J 50/60; H02J 50/50; H02J 50/80; H02J 50/10; H02J 50/05; H02J 50/40; H02J 7/35; H02J 50/20; H02J 50/30; H02J 50/15; H02J 2007/0062; H02J 50/23; H02J 7/0027; H02J 7/0029; H02J 7/0047; H02J 7/0055; H01L 2924/00; H01L 21/3065; H01L 21/02274; H01L 21/31116; H01L 28/20; H01L 28/40; H01L 29/2003; H01L 2224/48091; H01L 2924/01015; H01L 2924/01047; H01L 2924/1305; H01L 2924/13091; H01L 2924/1461; H01L 2924/181; H01L 2924/30107; H01L 2924/3011; H01L 2924/3025; H01L 2924/00012; H01L 2924/00014; H01L 29/7787; H01L 29/861; H01L 2224/48247; H01L 23/53285; H01L 2924/10253; H01L 2924/10329; H01L 39/126; H01L 39/128; H01L 39/143; H01L 39/225; H01L 21/31138; H01L 21/32136; H01L 27/0605; H01L 21/6831; H01L 2224/16225; H01L 2924/15153; H01J 37/32082; H01J 2237/334; H01J 37/32183; H01J 37/32174; H01J 37/321; H01J 37/3211; H01J 37/32137; H01J 37/32165; H01J 37/3244; H01J 37/32522; H01J 37/3299; H01J 2237/002; H01J 2237/3321; H01J 37/32155; H01J 37/32422; H01J 37/32577; H01J 37/32715; H01J 37/32917; H01J 37/32926; H01J 37/32935; H01J 37/3402; H01J 37/3429; H01J 37/3476
See application file for complete search history.

(56) References Cited

FOREIGN PATENT DOCUMENTS

| | | |
|---|---|---|
| KR | 101522891 B1 | 5/2015 |
| KR | 101522892 B1 | 5/2015 |

FIG. 8

PLASMA GENERATION APPARATUS, SUBSTRATE TREATING APPARATUS INCLUDING THE SAME, AND CONTROL METHOD FOR THE PLASMA GENERATION APPARATUS

CROSS-REFERENCE TO RELATED APPLICATIONS

A claim for priority under 35 U.S.C. § 119 is made to Korean Patent Application No. 10-2018-0091736 filed on Aug. 7, 2018 and Korean Patent Application No. 10-2019-0035804 filed on Mar. 28, 2019, in the Korean Intellectual Property Office, the entire contents of which are hereby incorporated by reference.

BACKGROUND

Embodiments of the inventive concept described herein relate to a plasma generation apparatus, a substrate treating apparatus including the same, and a control method for the plasma generation apparatus, and more particularly, relate to a plasma generation apparatus for generating plasma using a plurality of antennas, a substrate treating apparatus including the plasma generation apparatus, and a control method for the plasma generation apparatus.

Semiconductor manufacturing processes may include a process of treating a substrate using plasma. For example, among the semiconductor manufacturing processes, an etching process may remove a thin film on a substrate using plasma.

To use plasma in substrate treating processes, plasma generation units for generating plasma are mounted in process chambers. The plasma generation units are broadly classified into a Capacitively Coupled Plasma (CCP) type source and an Inductively Coupled Plasma (ICP) type source according to methods of generating plasma. The CCP type source applies an RF signal to either or both of electrodes that are disposed in a chamber to face each other and generates an electric field in the chamber, thereby generating plasma. The ICP type source applies an RF signal to one or more coils installed in a chamber and induces an electromagnetic field in the chamber, thereby generating plasma.

In the case where a chamber has two or more coils installed therein and the two or more coils receive power from one RF power supply, a current divider may be provided between the RF power supply and the coils, and an etching process may be performed on the entire region of a substrate by controlling the current divider. However, in the case of performing the etching process using the current divider, there may be a difference in etch rate between the central region and the edge region of the substrate due to an imbalance of plasma density in the chamber.

SUMMARY

Embodiments of the inventive concept provide a plasma generation apparatus for performing an etching process at a uniform etch rate over the entire region of a substrate, a substrate treating apparatus including the plasma generation apparatus, and a control method for the plasma generation apparatus.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for treating a substrate includes a chamber having a space therein in which the substrate is treated, a support unit that supports the substrate in the chamber, a gas supply unit that supplies gas into the chamber, and a plasma generation unit that excites the gas in the chamber into a plasma state. The plasma generation unit includes a high-frequency power supply, a first antenna connected to one end of the high-frequency power supply, a second antenna connected with the first antenna in parallel, and a current divider that distributes electric current to the first antenna and the second antenna. The current divider includes a first capacitor disposed between the first antenna and the second antenna, a second capacitor connected with the second antenna in parallel, and a third capacitor connected with the second antenna in series. The second capacitor and the third capacitor are implemented with a variable capacitor.

The first capacitor may be implemented with a constant capacitor, and the current divider may be disposed between the high-frequency power supply and the first and second antennas.

The current divider may distribute the electric current to the first antenna and the second antenna by adjusting capacitances of the second capacitor and the third capacitor.

The current divider may adjust a resonance of the second antenna by adjusting the capacitance of the second capacitor.

The current divider may control a current ratio of electric currents flowing through the first antenna and the second antenna by adjusting the capacitance of the third capacitor.

The current divider may control the resonance to be included in a preset range by adjusting the capacitance of the second capacitor and may control a current ratio of electric currents flowing through the first antenna and the second antenna by adjusting the capacitance of the third capacitor in a range in which a ratio of the capacitance of the third capacitor to the capacitance of the second capacitor is smaller than a value corresponding to the resonance.

The current divider may adjust the capacitance of the second capacitor based on plasma density in the chamber and may adjust the capacitance of the third capacitor to perform an etching process on the substrate.

The current divider may adjust the capacitance of the third capacitor in a range in which a ratio of the capacitance of the third capacitor to the capacitance of the second capacitor is smaller than a value corresponding to the resonance.

The current divider may control the resonance to be included in a range corresponding to a process performed in the chamber, by differently adjusting the capacitance of the second capacitor according to the process performed in the chamber.

The current divider may control an etch rate on an outer side of the substrate by adjusting the capacitance of the second capacitor and the capacitance of the third capacitor.

According to an exemplary embodiment, an apparatus for generating plasma in a chamber in which a process of treating a substrate is performed includes a high-frequency power supply, a first antenna connected to one end of the high-frequency power supply, a second antenna connected with the first antenna in parallel, and a current divider that distributes electric current to the first antenna and the second antenna. The current divider includes a first capacitor disposed between the first antenna and the second antenna, a second capacitor connected with the second antenna in parallel, and a third capacitor connected with the second antenna in series. The second capacitor and the third capacitor are implemented with a variable capacitor.

The first capacitor may be implemented with a constant capacitor, and the current divider may be disposed between the high-frequency power supply and the first and second antennas.

The current divider may distribute the electric current to the first antenna and the second antenna by adjusting capacitances of the second capacitor and the third capacitor.

The current divider may adjust a resonance of the second antenna by adjusting the capacitance of the second capacitor.

The current divider may control a current ratio of electric currents flowing through the first antenna and the second antenna by adjusting the capacitance of the third capacitor.

The current divider may control the resonance to be included in a preset range by adjusting the capacitance of the second capacitor and may control a current ratio of electric currents flowing through the first antenna and the second antenna by adjusting the capacitance of the third capacitor in a range in which a ratio of the capacitance of the third capacitor to the capacitance of the second capacitor is smaller than a value corresponding to the resonance.

The current divider may adjust the capacitance of the second capacitor based on plasma density in the chamber and may adjust the capacitance of the third capacitor to perform an etching process on the substrate.

The current divider may adjust the capacitance of the third capacitor in a range in which a ratio of the capacitance of the third capacitor to the capacitance of the second capacitor is smaller than a value corresponding to the resonance.

The current divider may control the resonance to be included in a range corresponding to the process performed in the chamber, by differently adjusting the capacitance of the second capacitor according to the process performed in the chamber.

The current divider may control an etch rate on an outer side of the substrate by adjusting the capacitance of the second capacitor and the capacitance of the third capacitor.

According to an exemplary embodiment, a method of controlling a plasma generation apparatus is provided. The plasma generation apparatus includes a high-frequency power supply, a first antenna, a second antenna connected with the first antenna in parallel, and a current divider that distributes electric current to the first antenna and the second antenna. The current divider includes a first capacitor disposed between the first antenna and the second antenna, a second capacitor connected with the second antenna in parallel, and a third capacitor connected with the second antenna in series, the second capacitor and the third capacitor being implemented with a variable capacitor. The method includes adjusting a resonance of the second antenna by adjusting capacitance of the second capacitor and controlling a current ratio of electric currents flowing through the first antenna and the second antenna by adjusting capacitance of the third capacitor.

The adjusting of the resonance may include adjusting the resonance such that the resonance is included in a preset range, and the controlling of the current ratio may include adjusting the capacitance of the third capacitor in a range in which a ratio of the capacitance of the third capacitor to the capacitance of the second capacitor is smaller than a value corresponding to the resonance.

The adjusting of the resonance may include adjusting the capacitance of the second capacitor based on plasma density in a chamber, and the controlling of the current ratio may include adjusting the capacitance of the third capacitor to perform an etching process on a substrate.

The method may further include controlling an etch rate on an outer side of a substrate by adjusting the capacitance of the second capacitor and the capacitance of the third capacitor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that the inventive concept is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Hereinafter, a substrate treating apparatus for etching a substrate using plasma according to an embodiment of the inventive concept will be described. However, without being limited thereto, the inventive concept is applicable to various types of apparatuses for heating a substrate placed thereon.

Figure 1:
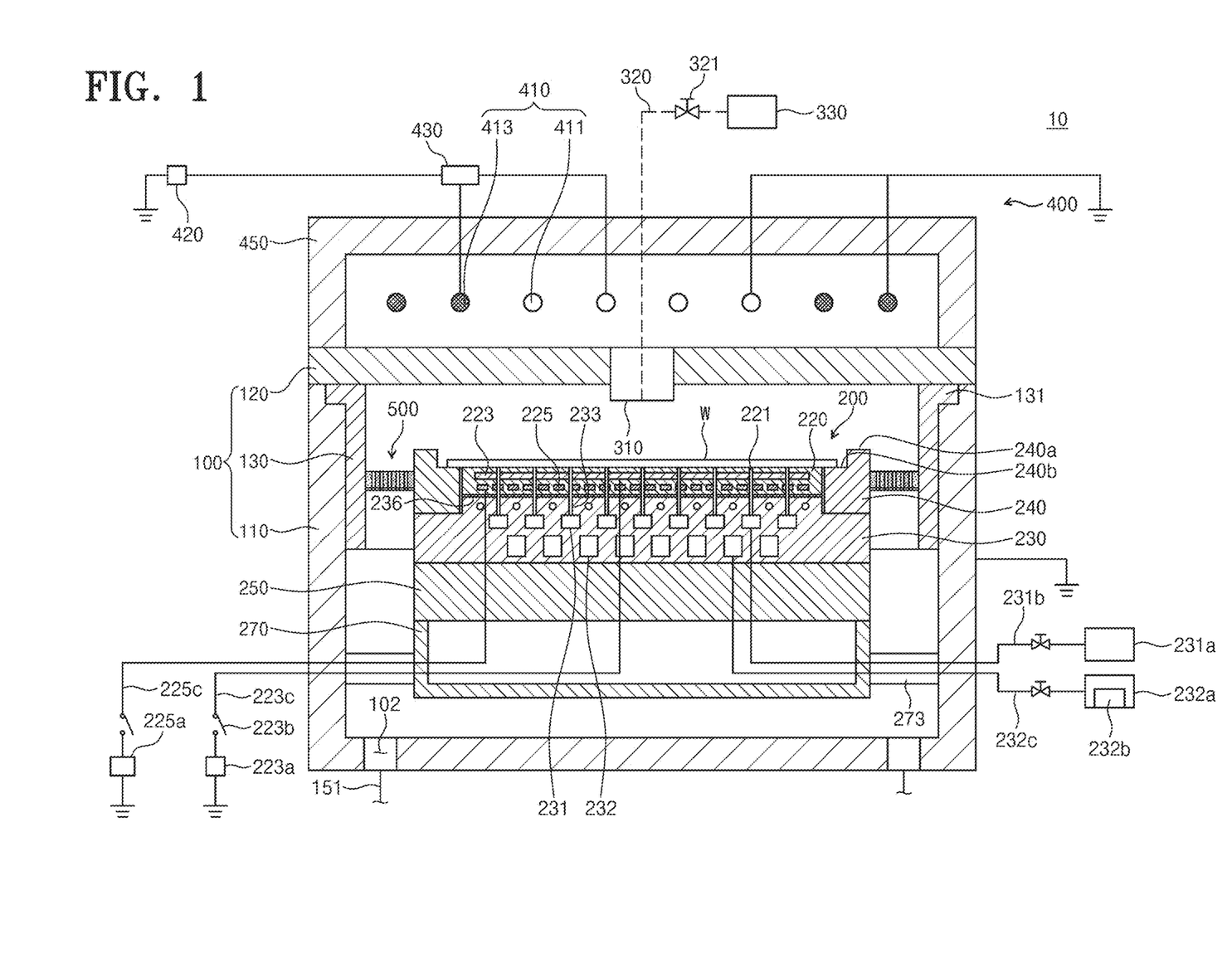
FIG. 1 is a view illustrating a substrate treating apparatus according to an embodiment of the inventive concept.

FIG. 1 is an exemplary view illustrating a substrate treating apparatus 10 according to an embodiment of the inventive concept.

Referring to FIG. 1, the substrate treating apparatus 10 treats a substrate W by using plasma. For example, the substrate treating apparatus 10 may perform an etching process on the substrate W. The substrate treating apparatus 10 may include a process chamber 100, a support unit 200, a gas supply unit 300, a plasma generation unit 400, and a baffle unit 500.

The process chamber 100 has a space in which a substrate treating process is performed. The process chamber 100 includes a housing 110, a sealing cover 120, and a liner 130.

The housing 110 has a space therein, which is open at the top. The inner space of the housing 110 serves as a processing space in which the substrate treating process is performed. The housing 110 is formed of metal. The housing 110 may be formed of aluminum. The housing 110 may be grounded. The housing 110 has an exhaust hole 102 formed in the bottom thereof. The exhaust hole 102 is connected with an exhaust line 151. Reaction byproducts generated in the substrate treating process and gases in the inner space of the housing 110 may be discharged to the outside through the exhaust line 151. The pressure inside the housing 110 is reduced to a predetermined pressure by the exhaust process.

The sealing cover 120 covers the open top of the housing 110. The sealing cover 120 has a plate shape and seals the inner space of the housing 110. The sealing cover 120 may include a dielectric substance window.

The liner 130 is provided inside the housing 110. The liner 130 is formed in a space that is open at the top and the bottom. The liner 130 may have a cylindrical shape. The liner 130 may have a radius corresponding to an inner surface of the housing 110. The liner 130 is provided along the inner surface of the housing 110. A support ring 131 is formed on an upper end of the liner 130. The support ring 131 is implemented with a plate in a ring shape and protrudes outside the liner 130 along the periphery of the liner 130. The support ring 131 is placed on an upper end of the housing 110 and supports the liner 130. The liner 130 may be formed of the same material as that of the housing 110. That is, the liner 130 may be formed of aluminum. The liner 130 protects the inner surface of the housing 110. Arc discharge may occur inside the process chamber 100 in a process of exciting a process gas. The arc discharge causes damage to surrounding devices. The liner 130 protects the inner surface of the housing 110, thereby preventing damage to the inner surface of the housing 110 by the arc discharge. Furthermore, the liner 130 prevents impurities generated during the substrate treating process from being deposited on an inner wall of the housing 110. The liner 130 is inexpensive and is easy to replace, compared with the housing 110. Therefore, in the case where the liner 130 is damaged by the arc discharge, an operator may replace the liner 130 with a new one.

The support unit 200 is located inside the housing 110. The support unit 200 supports the substrate W. The support unit 200 may include an electrostatic chuck 210 that clamps the substrate W using electrostatic force. Alternatively, the support unit 200 may support the substrate W in various manners such as mechanical clamping. Hereinafter, the support unit 200 including the electrostatic chuck 210 will be described.

The support unit 200 includes the electrostatic chuck 210, an insulation plate 250, and a lower cover 270. The support unit 200 may be located in the process chamber 100 and may be spaced apart upward from the bottom of the housing 110.

The electrostatic chuck 210 includes a dielectric plate 220, an electrode 223, a heater 225, a support plate 230, and a focus ring 240.

The dielectric plate 220 is located at the top of the electrostatic chuck 210. The dielectric plate 220 is formed of a dielectric substance in a circular plate shape. The substrate W is placed on an upper surface of the dielectric plate 220. The upper surface of the dielectric plate 220 has a smaller radius than the substrate W. Therefore, the edge region of the substrate W is located outside the dielectric plate 220. The dielectric plate 220 has a first supply fluid channel 221 formed therein. The first supply fluid channel 221 extends from the upper surface of the dielectric plate 210 to the bottom surface thereof. A plurality of first supply fluid channels 221 are formed to be spaced apart from each other and serve as passages through which a heat transfer medium is supplied to the backside of the substrate W.

The electrode 223 and the heater 225 are buried in the dielectric plate 220. The electrode 223 is located over the heater 225. The electrode 223 is electrically connected with a first lower power supply 223a. The first lower power supply 223a includes a Direct Current (DC) power supply. A switch 223b is installed between the electrode 223 and the first lower power supply 223a. The electrode 223 may be electrically connected with, or disconnected from, the first lower power supply 223a by turning on or off the switch 223b. When the switch 223b is turned on, DC current is applied to the electrode 223. Electrostatic force is applied between the electrode 223 and the substrate W by the current applied to the electrode 223, and the substrate W is clamped to the dielectric plate 220 by the electrostatic force.

The heater 225 is electrically connected with a second lower power supply 225a. The heater 225 generates heat by resisting current applied by the second lower power supply 225a. The generated heat is transferred to the substrate W through the dielectric plate 220. The substrate W is maintained at a predetermined temperature by the heat generated from the heater 225. The heater 225 includes a spiral coil.

The support plate 230 is located under the dielectric plate 220. The bottom surface of the dielectric plate 220 and an upper surface of the support plate 230 may be bonded together by an adhesive 236. The support plate 230 may be formed of aluminum. The upper surface of the support plate 230 may have a step such that the central region is located in a higher position than the edge region. The central region of the upper surface of the support plate 230 has an area corresponding to the bottom surface of the dielectric plate 220 and is bonded to the bottom surface of the dielectric plate 220. The support plate 230 has a first circulation fluid channel 231, a second circulation fluid channel 232, and second supply fluid channels 233 formed therein.

The first circulation fluid channel 231 serves as a passage through which the heat transfer medium circulates. The first circulation fluid channel 231 may be formed in a spiral shape in the support plate 230. Alternatively, the first circulation fluid channel 231 may include fluid channels in a ring shape that have different radii and the same center. The first circulation fluid channels 231 may connect to each other. The first circulation fluid channels 231 are formed at the same height.

The second circulation fluid channel 232 serves as a passage through which cooling fluid circulates. The second circulation fluid channel 232 may be formed in a spiral shape in the support plate 230. Alternatively, the second circulation fluid channel 232 may include fluid channels in a ring shape that have different radii and the same center. The second circulation fluid channels 232 may connect to each other. The second circulation fluid channels 232 may have a larger cross-sectional area than the first circulation fluid channels 231. The second circulation fluid channels 232 are formed at the same height. The second circulation fluid channels 232 may be located under the first circulation fluid channels 231.

The second supply fluid channels 233 extend upward from the first circulation fluid channels 231 to the upper surface of the support plate 230. As many second supply fluid channels 233 as the first supply fluid channels 221 are provided. The second supply fluid channels 233 connect the first circulation fluid channels 231 and the first supply fluid channels 221.

The first circulation fluid channels 231 are connected to a heat transfer medium reservoir 231a through a heat transfer medium supply line 231b. The heat transfer medium reservoir 231a has a heat transfer medium stored therein. The heat transfer medium includes an inert gas. According to an embodiment, the heat transfer medium includes a helium (He) gas. The helium gas is supplied into the first circulation fluid channels 231 through the heat transfer medium supply line 231b and then supplied to the backside of the substrate W via the second supply fluid channels 233 and the first supply fluid channels 221 in a serial order. The helium gas serves as a medium through which heat transferred from plasma to the substrate W is transferred to the electrostatic chuck 210.

The second circulation fluid channels 232 are connected with a cooling fluid reservoir 232a through a cooling fluid supply line 232c. The cooling fluid reservoir 232a has cooling fluid stored therein. The cooling fluid reservoir 232a may include a cooler 232b therein. The cooler 232b cools the cooling fluid to a predetermined temperature. Alternatively, the cooler 232b may be mounted on the cooling fluid supply line 232c. The cooling fluid supplied into the second circulation fluid channels 232 via the cooling fluid supply line 232c cools the support plate 230 while circulating along the second circulation fluid channels 232. The support plate 230, while being cooled, cools the dielectric plate 220 and the substrate W together to maintain the substrate W at a predetermined temperature.

The focus ring 240 is disposed on the edge region of the electrostatic chuck 210. The focus ring 240 has a ring shape and is disposed around the dielectric plate 220. An upper surface of the focus ring 240 may have a step such that an outer portion 240a is located in a higher position than an inner portion 240b. The inner portion 240b of the upper surface of the focus ring 240 is located at the same height as the upper surface of the dielectric plate 220. The inner portion 240b of the upper surface of the focus ring 240 supports the edge region of the substrate W that is located outside the dielectric plate 220. The outer portion 240a of the focus ring 240 surrounds the edge region of the substrate W. The focus ring 240 allows plasma in the process chamber 100 to be concentrated on the region opposite the substrate W.

The insulation plate 250 is located under the support plate 230. The insulation plate 250 has a cross-sectional area corresponding to that of the support plate 230. The insulation plate 250 is located between the support plate 230 and the lower cover 270. The insulation plate 250 is formed of an insulating material and electrically insulates the support plate 230 and the lower cover 270.

The lower cover 270 is located at the bottom of the support unit 200. The lower cover 270 is spaced apart upward from the bottom of the housing 110. The lower cover 270 has a space formed therein, which is open at the top. The open top of the lower cover 270 is covered with the insulation plate 250. Accordingly, the outer diameter of the cross-section of the lower cover 270 may be the same as the outer diameter of the insulation plate 250. The lower cover 270 may have, in an inner space thereof, a lift pin module (not illustrated) that moves the transferred substrate W from an external transfer member to the electrostatic chuck 210.

The lower cover 270 has a connecting member 273. The connecting member 273 connects the outer surface of the lower cover 270 and the inner wall of the housing 110. A plurality of connecting members 273 may be provided at predetermined intervals on the outer surface of the lower cover 270. The connecting members 273 support the support unit 200 inside the process chamber 100. Furthermore, the connecting members 273 are connected with the inner wall of the housing 110 to allow the lower cover 270 to be electrically grounded. A first power line 223c connected with the first lower power supply 223a, a second power line 225c connected with the second lower power supply 225a, the heat transfer medium supply line 231b connected with the heat transfer medium reservoir 231a, and the cooling fluid supply line 232c connected with the cooling fluid reservoir 232a extend toward the inside of the lower cover 270 via the inner spaces of the connecting members 273.

The gas supply unit 300 supplies a process gas into the process chamber 100. The gas supply unit 300 includes a gas supply nozzle 310, a gas supply line 320, and a gas reservoir 330. The gas supply nozzle 310 is installed in the center of the sealing cover 120. The gas supply nozzle 310 has an injection hole formed in a bottom surface thereof. The injection hole is located below the sealing cover 120 and supplies the process gas into the processing space in the process chamber 100. The gas supply line 320 connects the gas supply nozzle 310 and the gas reservoir 330. The gas supply line 320 supplies the process gas stored in the gas reservoir 330 to the gas supply nozzle 310. A valve 321 is installed in the gas supply line 320. The valve 321 opens or closes the gas supply line 320 and adjusts the flow rate of the process gas supplied through the gas supply line 320.

The plasma generation unit 400 excites the process gas in the process chamber 100 into a plasma state. According to an embodiment of the inventive concept, the plasma generation unit 400 may be of an ICP type.

The plasma generation unit 400 may include a high-frequency power supply 420, a first antenna 411, a second antenna 413, and a current divider 430. The high-frequency power supply 420 supplies a high-frequency signal. For example, the high-frequency power supply 420 may be an RF power supply 420. The RF power supply 420 supplies RF power. Hereinafter, it will be exemplified that the high-frequency power supply 420 is the RF power supply 420. The first antenna 411 and the second antenna 413 are connected with the RF power supply 420 in series. Each of the first antenna 411 and the second antenna 413 may be implemented with a coil wound a plurality of times. The first antenna 411 and the second antenna 413 are electrically connected to the RF power supply 420 to receive RF power. The current divider 430 distributes the current from the RF power supply 420 to the first antenna 411 and the second antenna 413.

The first antenna 411 and the second antenna 413 may be disposed in positions opposite the substrate W. For example, the first antenna 411 and the second antenna 413 may be installed over the process chamber 100. The first antenna 411 and the second antenna 413 may have a ring shape. The first antenna 411 may have a smaller radius than the second antenna 413. Furthermore, the first antenna 411 may be located on an upper inner side of the process chamber 100, and the second antenna 413 may be located on an upper outer side of the process chamber 100.

According to an embodiment, the first and second antennas 411 and 413 may be disposed around a side of the process chamber 100. According to an embodiment, one of the first and second antennas 411 and 413 may be disposed over the process chamber 100, and the other may be disposed around the side of the process chamber 100. The positions of the antennas 411 and 413 are not limited as long as the antennas 411 and 413 generate plasma in the process chamber 100.

The first antenna 411 and the second antenna 413 may receive RF power from the RF power supply 420 and may induce a time varying electro-magnetic field in the process chamber 100. Accordingly, the process gas supplied into the process chamber 100 may be excited into plasma.

The baffle unit 500 is located between the inner wall of the housing 110 and the support unit 200. The baffle unit 500 includes a baffle having through-holes. The baffle has an annular ring shape. The process gas supplied into the housing 110 passes through the through-holes of the baffle and is discharged through the exhaust hole 102. The flow of the process gas may be controlled depending on the shape of the baffle and the shape of the through-holes.

Figure 2:
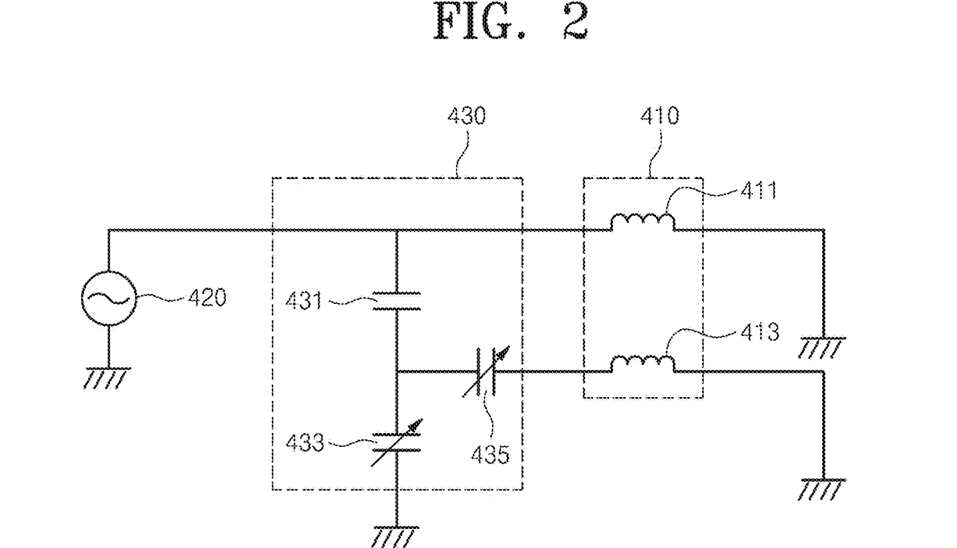
FIG. 2 is a view illustrating a plasma generation unit according to an embodiment of the inventive concept.

FIG. 2 is an exemplary view illustrating the plasma generation unit 400 according to an embodiment of the inventive concept.

As illustrated in FIG. 2, the plasma generation unit 400 includes the RF power supply 420, the first antenna 411, the second antenna 413, and the current divider 430.

The RF power supply 420 may generate an RF signal. According to an embodiment of the inventive concept, the RF power supply 420 may generate a sinusoidal wave having a preset frequency. However, without being limited thereto, the RF power supply 420 may generate various forms of RF signals such as a sawtooth wave, a triangular wave, and the like.

The first antenna 411 and the second antenna 413 receive the RF signal from the RF power supply 420 and induce an electro-magnetic field to generate plasma. Although the plasma generation unit 400 illustrated in FIG. 2 includes a total of two antennas 411 and 413, the number of antennas is not limited thereto, and three or more antennas may be provided according to embodiments.

The current divider 430 is installed between the RF power supply 420 and the first and second antennas 411 and 413 and distributes the current from the RF power supply 420 to the first and second antennas 411 and 413. The current divider 430 according to an embodiment of the inventive concept may include a first capacitor 431, a second capacitor 433, and a third capacitor 435. The first capacitor 431 may be disposed between the first antenna 411 and the second antenna 413. The first capacitor 431 may be implemented with a constant capacitor. The second capacitor 433 may be connected with the second antenna 413 in parallel. The second capacitor 433 may be implemented with a variable capacitor, and the current divider 430 may adjust the capacitance of the second capacitor 433 to shift the position of resonance of the second antenna 413. The third capacitor 435 may be connected with the second antenna 413 in series. The third capacitor 435 may be implemented with a variable capacitor, and the current divider 430 may adjust the capacitance of the third capacitor 435 to control the current ratio of electric currents flowing through the first antenna 411 and the second antenna 413. That is, the second capacitor 433 and the third capacitor 435 may be implemented with a variable capacitor, and therefore the capacitances of the second capacitor 433 and the third capacitor 435 may be adjusted. The current divider 430 may adjust the capacitances of the second capacitor 433 and the third capacitor 435 to control plasma density in the process chamber 100. In this case, the current divider 430 may adjust the capacitance of the second capacitor 433 to adjust the resonance of the second antenna 413 and may thereafter adjust the capacitance of the third capacitor 435 to control the current ratio of electric currents flowing through the first and second antennas 411 and 413. Accordingly, in the region where the ratio of the capacitance of the third capacitor 435 to the capacitance of the second capacitor 433 is smaller than the resonance, the current divider 430 may adjust the capacitance of the third capacitor 435 to control the plasma density, thereby uniformly controlling the etch rate in the entire region of a substrate in an etching process.

Figure 3:
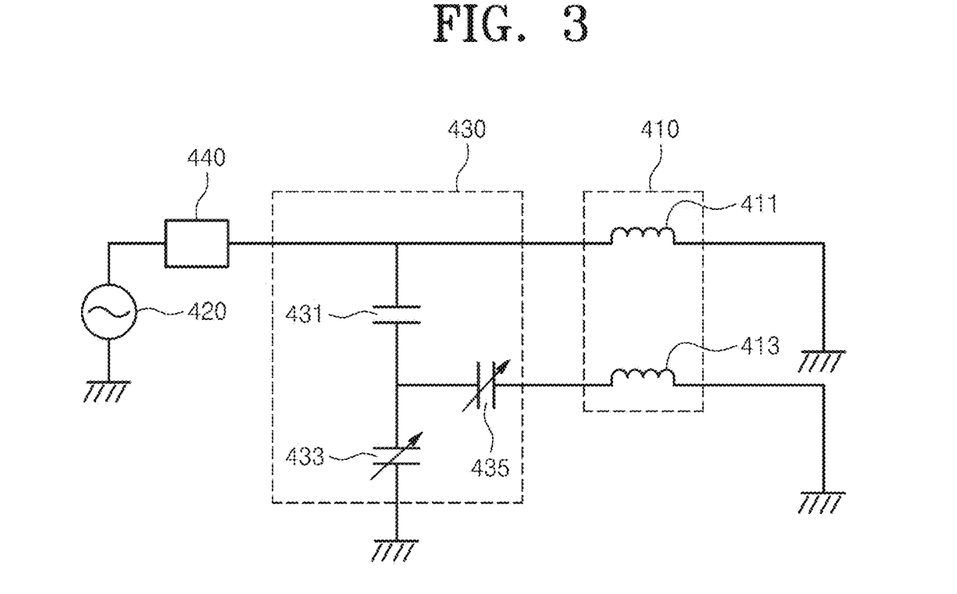
FIG. 3 is a view illustrating a plasma generation unit according to another embodiment of the inventive concept.

A plasma generation unit according to another embodiment of the inventive concept may further include an impedance matching device 440 as illustrated in FIG. 3. The impedance matching device 440 may be connected to an output terminal of the RF power supply 420 and may match the output impedance at the power supply side and the input impedance at the load side.

Hereinafter, a process in which the plasma generation unit according to the embodiment of the inventive concept generates plasma and performs an etching process will be described in more detail with reference to FIGS. 4 to 8.

Figure 4:
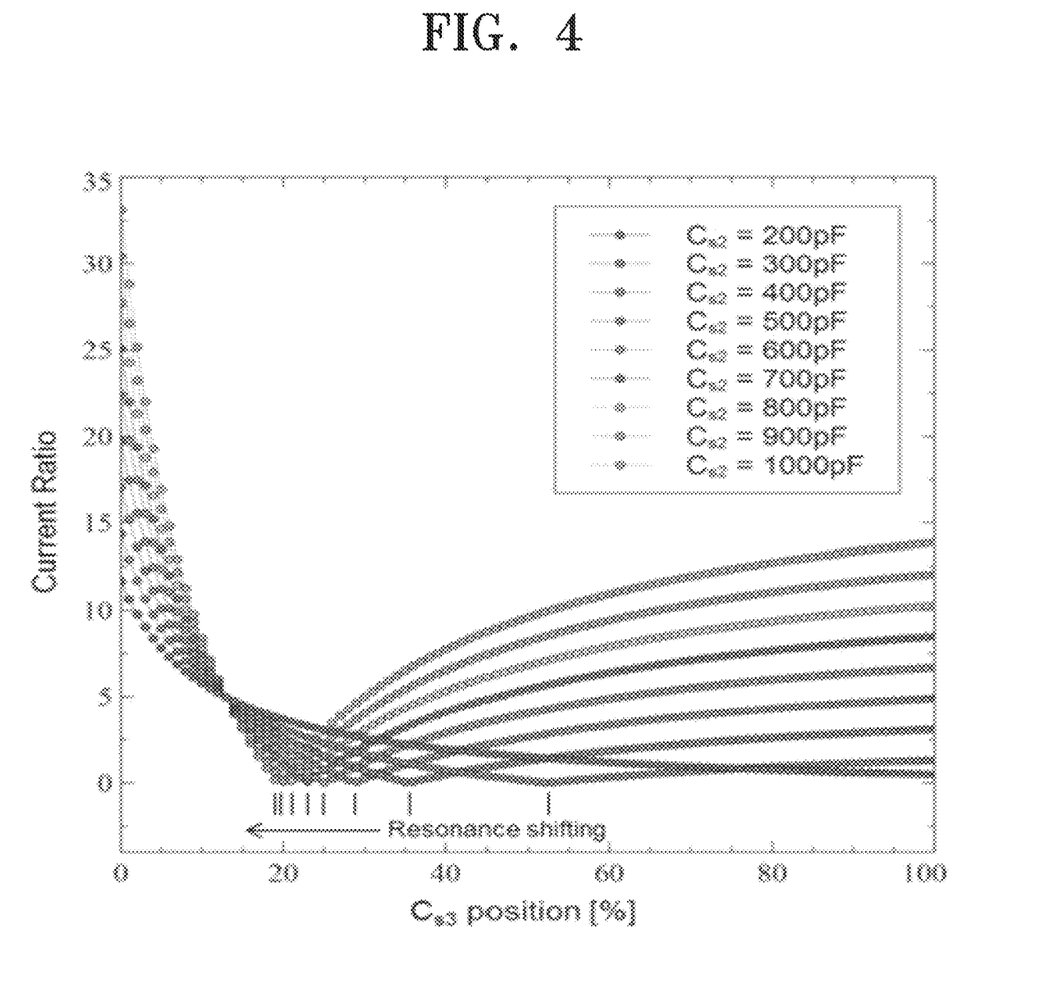
FIG. 4 is a view illustrating a method of shifting the resonance of a second antenna by adjusting the capacitance of a second capacitor according to an embodiment of the inventive concept.
Figure 5:
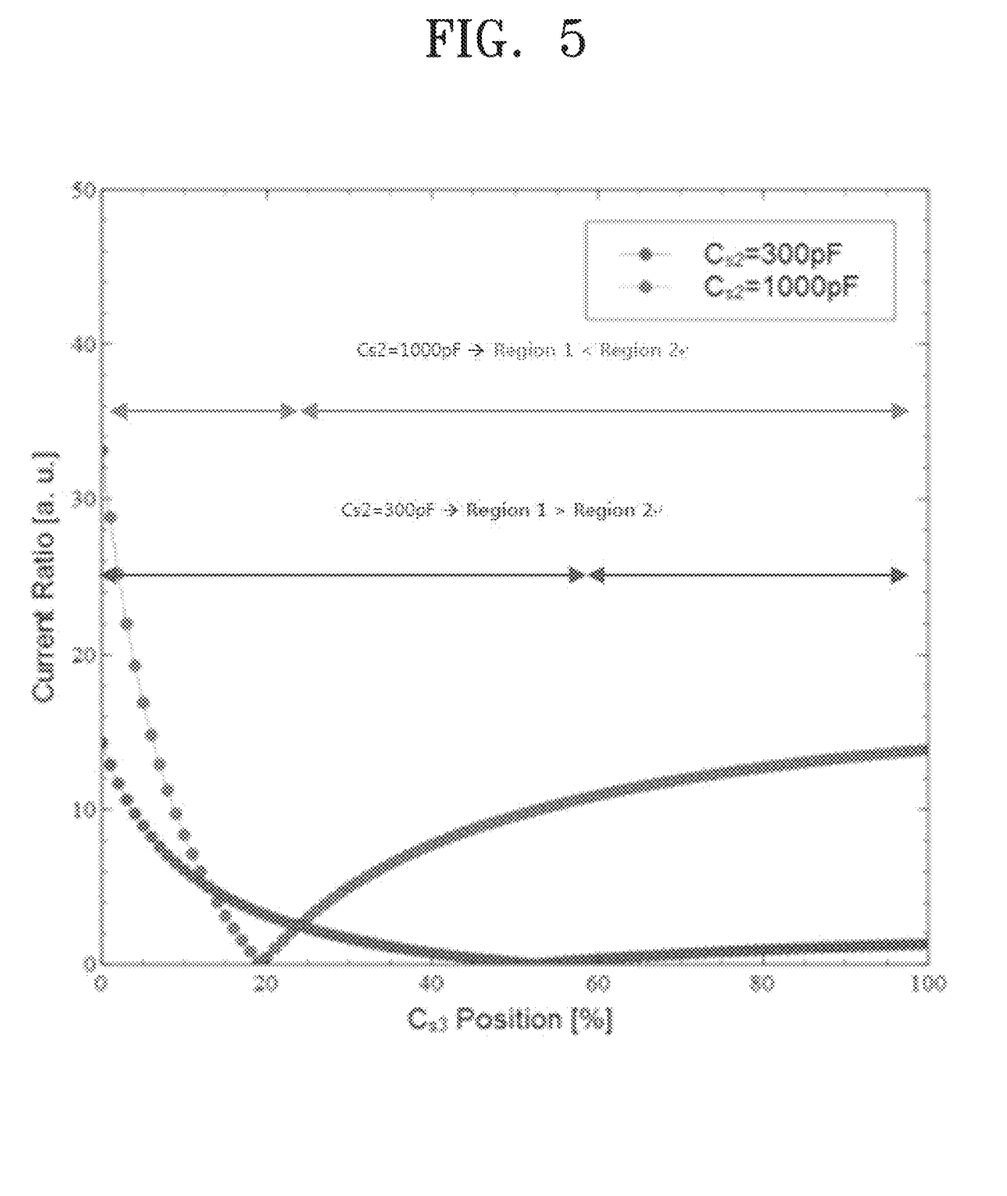
FIG. 5 is a view illustrating a method of removing a current ratio difference according to chambers by adjusting the capacitance of the second capacitor according to an embodiment of the inventive concept.

Referring to FIG. 4, as the capacitance of the second capacitor 433 decreases from 1000 pF to 300 pF, the resonance of the second antenna 413 shifts to the right (in the direction in which the ratio of the capacitance of the third capacitor 435 to the capacitance of the second capacitor 433 increases). Accordingly, the region to the left of the resonance (the region where the ratio of the capacitance of the third capacitor 435 to the capacitance of the second capacitor 433 is relatively small) increases. That is, when the region where the ratio of the capacitance of the third capacitor 435 to the capacitance of the second capacitor 433 is smaller than the resonance is defined as a first region (region 1) and the region where the ratio of the capacitance of the third capacitor 435 to the capacitance of the second capacitor 433 is larger than the resonance is defined as a second region (region 2), the size of the first region increases with the decrease in the capacitance of the second capacitor 433 from 1000 pF to 300 pF as illustrated in FIG. 5. A user may appropriately adjust the capacitance of the second capacitor 433 to shift the resonance of the second antenna 413 and may thereafter adjust the capacitance of the third capacitor 435 in the first region to control the current ratio of electric currents flowing through the first and second antennas 411 and 413, thereby controlling the plasma density in the process chamber 100. In this case, the etch rate may be more uniformly controlled in the entire region of a substrate than when the plasma density is controlled by adjusting the capacitance of the third capacitor 435 in the second region.

Figure 6:
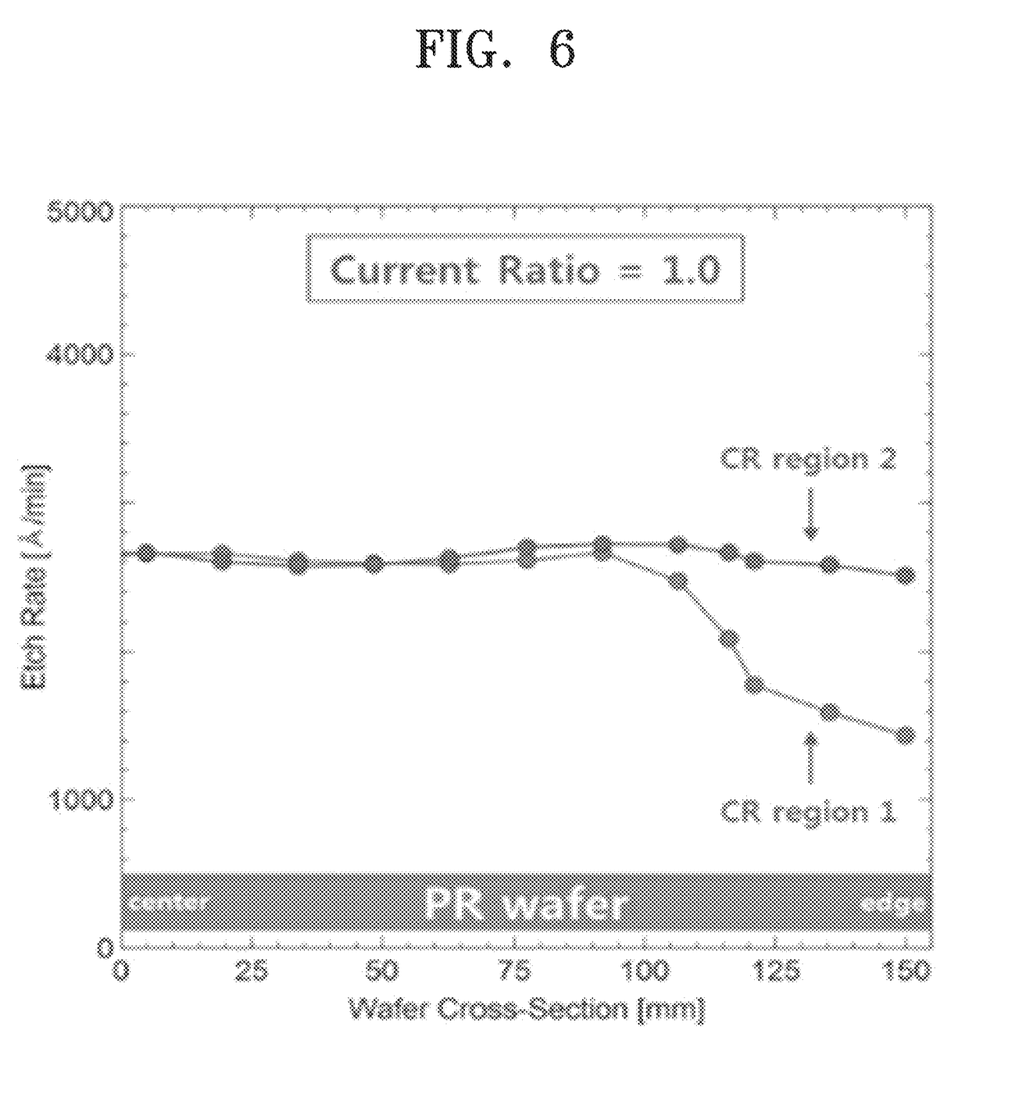
FIG. 6 is a view illustrating a method of removing an etch rate difference according to chambers by adjusting the capacitance of the second capacitor according to an embodiment of the inventive concept.

That is, as illustrated in FIG. 6, in the case of controlling the plasma density by adjusting the capacitance of the third capacitor 435 in the second region, the etch rate in the edge region of a substrate decreases when an etching process is performed on the substrate, whereas in the case of controlling the plasma density by adjusting the capacitance of the third capacitor 435 in the first region, the etch rate may be uniform over the entire region of a substrate. In the above-described embodiment, it has been described that the second capacitor 433 has capacitances of 300 pF and 1000 pF. However, without being limited thereto, the second capacitor 433 may have various capacitances. The second capacitor 433 may preferably have a capacitance of 200 pF to 1000 pF.

Referring again to FIG. 4, the position of the resonance may be adjusted to be included in a preset range by adjusting the capacitance of the second capacitor 433. The current ratio of electric currents flowing through the first and second antennas 411 and 413 may be controlled by adjusting the capacitance of the third capacitor 435 in the range (the first region) in which the ratio of the capacitance of the third capacitor 435 to the capacitance of the second capacitor 433 is smaller than the resonance. That is, the resonance may be allowed to be included in a specific range by adjusting the capacitance of the second capacitor 433 in a predetermined range. Accordingly, the size of the first region may be adjusted to a predetermined size or more, and the current ratio of electric currents flowing through the first and second antennas 411 and 413 may be controlled by adjusting the capacitance of the third capacitor 435 in the first region. Thus, an etching process may be performed to provide a uniform etch rate over the entire region of a substrate. For example, the capacitance of the second capacitor 433 may be adjusted in the range of 200 pF to 500 pF, and therefore an etching process may be performed on a substrate by adjusting the capacitance of the third capacitor 435 in the first region. The capacitance of the second capacitor 433 may preferably be 200 pF. However, without being limited thereto, the capacitance of the second capacitor 433 may be adjusted in an appropriate range. The capacitance of the second capacitor 433 may be adjusted to allow the resonance to be included in a specific rage.

Furthermore, the current divider 430 may adjust the capacitance of the second capacitor 433 based on the plasma density in the process chamber 100 to shift the resonance of the second antenna 412 and may thereafter adjust the capacitance of the third capacitor 435 to perform an etching process on a substrate. The current divider 430 may adjust the capacitance of the second capacitor 433 to correspond to the difference between the plasma density in the process chamber 100 and a preset plasma density and may thereafter adjust the capacitance of the third capacitor 435 to rapidly change the plasma density in the process chamber 100, thereby allowing an etching process to be efficiently performed.

Figure 7:
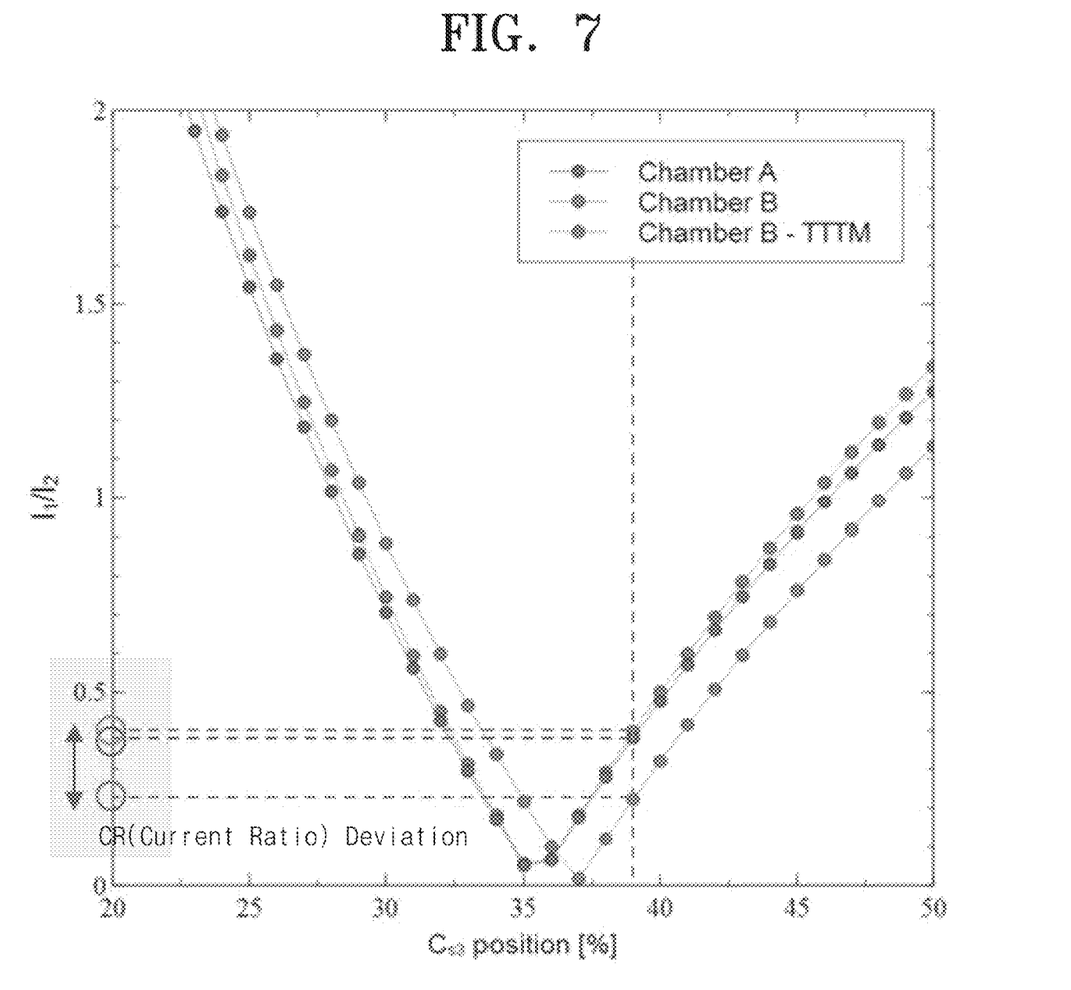
FIG. 7 is a view illustrating a method of differently setting the capacitance range of a third capacitor used in an etching process by adjusting the capacitance of the second capacitor according to an embodiment of the inventive concept.

Meanwhile, in a plurality of different chambers, the current ratios of electric currents flowing through the first and second antennas 411 and 413 may differ from each other under the same condition of the current divider 430 according to chamber environments. In this case, the current ratios of electric currents flowing through the first and second antennas 411 and 413 in the plurality of chambers may be set to be the same, by adjusting the capacitance of the second capacitor 433. That is, as illustrated in FIG. 7, the current ratios of electric currents flowing through the first and second antennas 411 and 413 under the same condition of the current divider 430 in chambers A and B differ from each other. Therefore, the current ratios of electric currents flowing through the first and second antennas 411 and 413 of the chambers A and B under the same condition may be set to be the same, by adjusting the capacitance of the second capacitor 433 in the current divider 430 of the chamber B.

Figure 8:
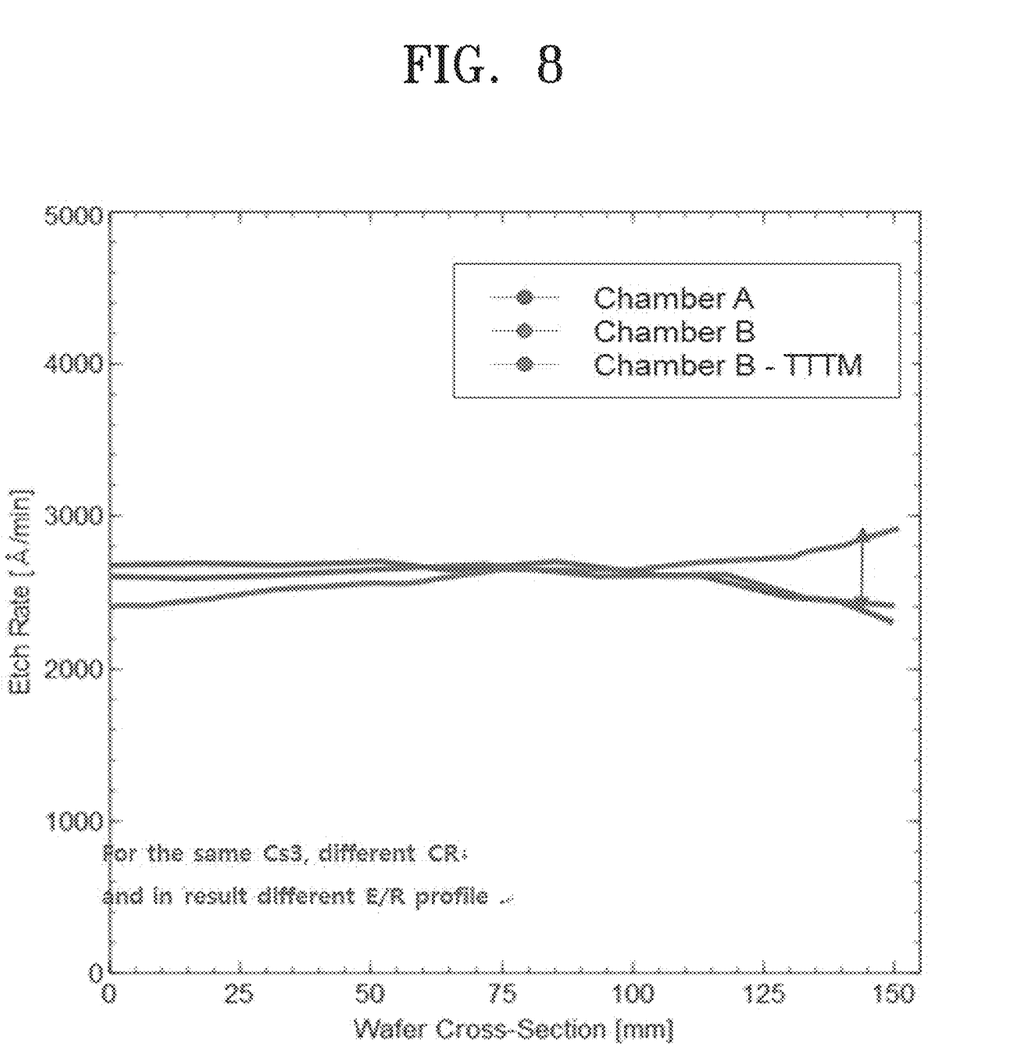
FIG. 8 is a view illustrating a feature of providing a uniform etch rate over the entire region of a substrate by adjusting the capacitance of the second capacitor according to an embodiment of the inventive concept.

Referring to FIG. 8, the etch rates for regions of substrates in a plurality of different chambers (chamber A and chamber B) may differ from each other. In this case, the etch rates for the regions of the substrates in the chambers A and B may be set to be the same, by adjusting the capacitance of the second capacitor 433. That is, the current divider 430 according to the embodiment of the inventive concept may adjust the capacitance of the second capacitor 433 to compensate for the difference in the current ratio of electric currents flowing through the antennas between the plurality of chambers and compensate for the difference between the etch rates for the regions of the substrates.

Figure 9:
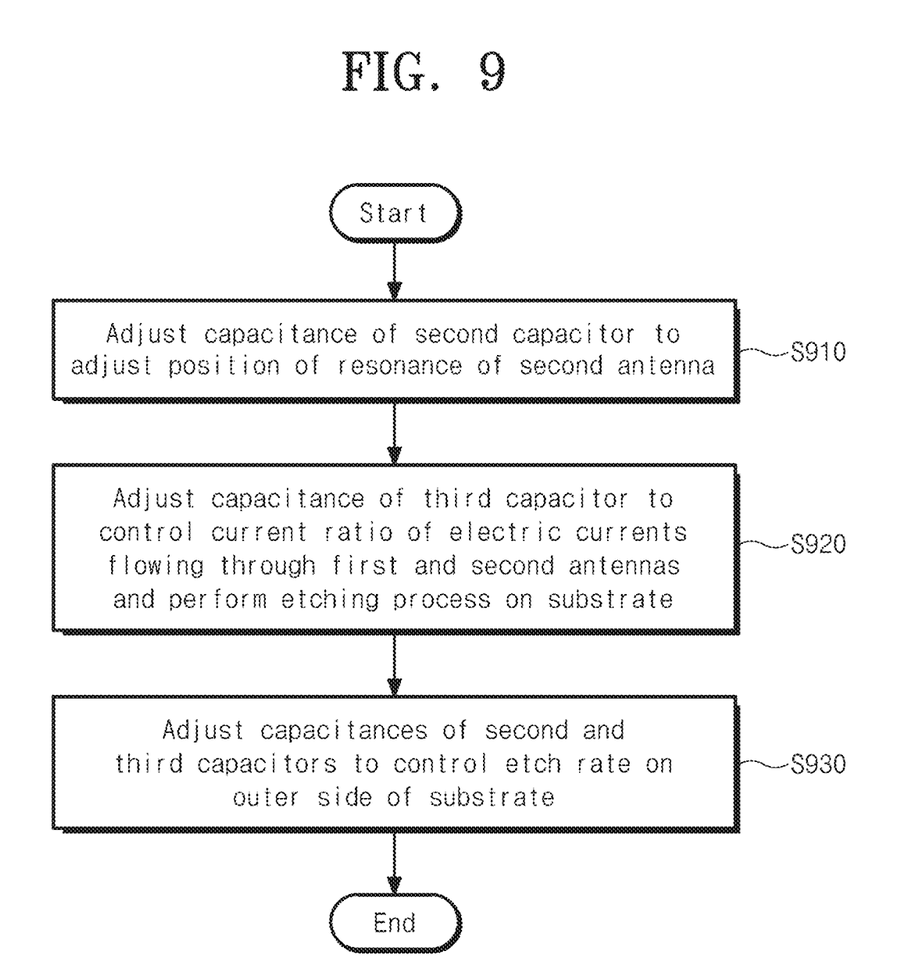
FIG. 9 is a flowchart illustrating a plasma generation unit control method according to an embodiment of the inventive concept.

FIG. 9 is a flowchart illustrating a plasma generation unit control method according to an embodiment of the inventive concept.

First, the current divider 430 adjusts the capacitance of the second capacitor to adjust the position of the resonance of the second antenna (S910). Here, the current divider 430 may adjust the capacitance of the second capacitor such that the position of the resonance of the second antenna is included in a preset range. Furthermore, the capacitance of the second capacitor may be adjusted based on the plasma density in the process chamber.

Next, the current divider 430 adjusts the capacitance of the third capacitor to control the current ratio of electric currents flowing through the first and second antennas and perform an etching process on a substrate (S920). In this case, the capacitance of the third capacitor may be adjusted in the range (the first region) in which the ratio of the capacitance of the third capacitor to the capacitance of the second capacitor is smaller than the resonance.

Then, the current divider 430 adjusts the capacitances of the second and third capacitors to control the etch rate on an outer side of the substrate (S930). Specifically, the current divider 430 adjusts the capacitance of the second capacitor to adjust the position of the resonance of the second antenna and thereafter adjusts the capacitance of the third capacitor in the range (the first region) smaller than the resonance to adjust the current ratio of electric currents flowing through the first and second antennas, thereby allowing the etching process to be performed to provide a uniform etch rate over the entire region of the substrate.

The above-described plasma generation unit control method may be implemented as a program that can be executed by a computer. The plasma generation unit control method may be executed in an application form and may be stored in a computer readable recording medium. Here, the computer readable recording medium may be, but is not limited to, a volatile memory such as a Static RAM (SRAM), a Dynamic RAM (DRAM) or a Synchronous DRAM (SDRAM), a non-volatile memory such as a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM) or a Ferroelectric RAM (FRAM), a floppy disk, a hard disk, or an optically readable medium (e.g., a storage medium such as a CD-ROM, a DVD, or the like).

According to the various embodiments, the inventive concept may adjust the resonance of a coil during an etching process to adjust a current ratio in a specific range, thereby providing a uniform etch rate over the entire region of a substrate.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. For example, the components illustrated in the embodiments of the inventive concept can be implemented in a distributed manner. Likewise, the components described to be distributed can be implemented in a combined manner. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber having a space therein in which the substrate is treated;
   a support unit configured to support the substrate in the chamber;
   a gas supply unit configured to supply gas into the chamber; and
   a plasma generation unit configured to excite the gas in the chamber into a plasma state,
   wherein the plasma generation unit includes:
   a high-frequency power supply;
   a first antenna connected to one end of the high-frequency power supply;
   a second antenna connected with the first antenna in parallel; and
   a current divider configured to distribute electric current to the first antenna and the second antenna,
   wherein the current divider includes:
   a first capacitor connected between the first antenna and the second antenna;
   a second capacitor connected with the second antenna in parallel; and
   a third capacitor connected with the second antenna in series, and
   wherein the second capacitor and the third capacitor are implemented with a variable capacitor.

2. The apparatus of claim 1, wherein the first capacitor is implemented with a constant capacitor, and wherein the current divider connected between the high-frequency power supply and the first and second antennas.

3. The apparatus of claim 2, wherein the current divider distributes the electric current to the first antenna and the second antenna by adjusting capacitances of the second capacitor and the third capacitor.

4. The apparatus of claim 3, wherein the current divider adjusts a resonance of the second antenna by adjusting the capacitance of the second capacitor.

5. The apparatus of claim 3, wherein the current divider controls a current ratio of electric currents flowing through the first antenna and the second antenna by adjusting the capacitance of the third capacitor.

6. The apparatus of claim 4, wherein the current divider controls the resonance to be included in a preset range by adjusting the capacitance of the second capacitor and controls a current ratio of electric currents flowing through the first antenna and the second antenna by adjusting the capacitance of the third capacitor in a range in which a ratio of the capacitance of the third capacitor to the capacitance of the second capacitor is smaller than a value corresponding to the resonance.

7. The apparatus of claim 4, wherein the current divider adjusts the capacitance of the second capacitor based on plasma density in the chamber and adjusts the capacitance of the third capacitor to perform an etching process on the substrate.

8. The apparatus of claim 7, wherein the current divider adjusts the capacitance of the third capacitor in a range in which a ratio of the capacitance of the third capacitor to the capacitance of the second capacitor is smaller than a value corresponding to the resonance.

9. The apparatus of claim 4, wherein the current divider controls the resonance to be included in a range corresponding to a process performed in the chamber, by adjusting the capacitance of the second capacitor according to the process performed in the chamber.

10. The apparatus of claim 3, wherein the current divider controls an etch rate on an edge region of the substrate by adjusting the capacitance of the second capacitor and the capacitance of the third capacitor.

11. An apparatus for generating plasma in a chamber in which a process of treating a substrate is performed, the apparatus comprising:
    a high-frequency power supply;
    a first antenna connected to one end of the high-frequency power supply;
    a second antenna connected with the first antenna in parallel; and
    a current divider configured to distribute electric current to the first antenna and the second antenna,
    wherein the current divider includes:
    a first capacitor connected between the first antenna and the second antenna;
    a second capacitor connected with the second antenna in parallel; and
    a third capacitor connected with the second antenna in series, and
    wherein the second capacitor and the third capacitor are implemented with a variable capacitor.

12. The apparatus of claim 11, wherein the first capacitor is implemented with a constant capacitor, and wherein the current divider connected between the high-frequency power supply and the first and second antennas.

13. The apparatus of claim 12, wherein the current divider distributes the electric current to the first antenna and the second antenna by adjusting capacitances of the second capacitor and the third capacitor.

14. The apparatus of claim 13, wherein the current divider adjusts a resonance of the second antenna by adjusting the capacitance of the second capacitor.

15. The apparatus of claim 13, wherein the current divider controls a current ratio of electric currents flowing through the first antenna and the second antenna by adjusting the capacitance of the third capacitor.

16. The apparatus of claim 14, wherein the current divider controls the resonance to be included in a preset range by adjusting the capacitance of the second capacitor and controls a current ratio of electric currents flowing through the first antenna and the second antenna by adjusting the capacitance of the third capacitor in a range in which a ratio of the capacitance of the third capacitor to the capacitance of the second capacitor is smaller than a value corresponding to the resonance.

17. The apparatus of claim 14, wherein the current divider adjusts the capacitance of the second capacitor based on plasma density in the chamber and adjusts the capacitance of the third capacitor to perform an etching process on the substrate.

18. The apparatus of claim 17, wherein the current divider adjusts the capacitance of the third capacitor in a range in which a ratio of the capacitance of the third capacitor to the capacitance of the second capacitor is smaller than a value corresponding to the resonance.

19. The apparatus of claim 14, wherein the current divider controls the resonance to be included in a range corresponding to the process performed in the chamber, by adjusting the capacitance of the second capacitor according to the process performed in the chamber.

20. The apparatus of claim 13, wherein the current divider controls an etch rate on an edge region of the substrate by adjusting the capacitance of the second capacitor and the capacitance of the third capacitor.

21. A method of controlling a plasma generation apparatus, wherein the plasma generation apparatus includes a high-frequency power supply, a first antenna, a second antenna connected with the first antenna in parallel, and a current divider configured to distribute electric current to the first antenna and the second antenna,
wherein the current divider includes a first capacitor disposed between the first antenna and the second antenna, a second capacitor connected with the second antenna in parallel, and a third capacitor connected with the second antenna in series, the second capacitor and the third capacitor being implemented with a variable capacitor, and
wherein the method comprises:
adjusting a resonance of the second antenna by adjusting capacitance of the second capacitor; and
controlling a current ratio of electric currents flowing through the first antenna and the second antenna by adjusting capacitance of the third capacitor.

22. The method of claim 21, wherein the adjusting of the resonance includes:
adjusting the resonance such that the resonance is included in a preset range, and
wherein the controlling of the current ratio includes:
adjusting the capacitance of the third capacitor in a range in which a ratio of the capacitance of the third capacitor to the capacitance of the second capacitor is smaller than a value corresponding to the resonance.

23. The method of claim 21, wherein the adjusting of the resonance includes:
adjusting the capacitance of the second capacitor based on plasma density in a chamber, and
wherein the controlling of the current ratio includes:
adjusting the capacitance of the third capacitor to perform an etching process on a substrate.

24. The method of claim 21, further comprising:
controlling an etch rate on an edge region of a substrate by adjusting the capacitance of the second capacitor and the capacitance of the third capacitor.

* * * * *